(12) United States Patent
Chou (10) Patent No.: US 7,932,764 B2
(45) Date of Patent: Apr. 26, 2011

(54) DELAY CIRCUIT WITH CONSTANT TIME DELAY INDEPENDENT OF TEMPERATURE VARIATIONS

(75) Inventor: Min-Chung Chou, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 11 days.

(21) Appl. No.: 11/951,331

(22) Filed: Dec. 6, 2007

(65) Prior Publication Data

US 2009/0146726 A1 Jun. 11, 2009

(51) Int. Cl.
*H03H 11/26* (2006.01)
(52) U.S. Cl. ......... 327/268; 327/264; 327/261; 327/108
(58) Field of Classification Search .................. 327/261, 327/263, 264, 268, 108, 112; 326/82, 83
See application file for complete search history.

(56) References Cited

U.S. PATENT DOCUMENTS

| 4,868,525 | A  | * | 9/1989 | Dias | 331/111 |
| 6,573,543 | B2 | * | 6/2003 | Takata | 257/295 |
| 7,248,091 | B2 | * | 7/2007 | Chung | 327/262 |
| 7,295,055 | B2 | * | 11/2007 | Noguchi et al. | 327/291 |
| 7,746,141 | B2 | * | 6/2010 | Takahashi | 327/261 |

* cited by examiner

*Primary Examiner* — Long Nguyen
(74) *Attorney, Agent, or Firm* — Jianq Chyun IP Office (57) ABSTRACT

A delay circuit has: an inverting receiver with a resistive element, the inverting receiver having an input node for receiving an input signal and an output node coupled to the resistive element; a capacitive element, coupled to the output node of the inverting receiver and the resistive element; a first transistor, having lower turned ON voltage at higher temperature; a second transistor, used for generating a rail to rail signals on a terminal of the first transistor; and an output inverter, having an input node coupled to the first transistor and an output node for outputting an output signal of the delay circuit. Further, a third transistor is used for enhancing pulling low of the output signal of the delay circuit.

14 Claims, 7 Drawing Sheets

DELAY CIRCUIT WITH CONSTANT TIME DELAY INDEPENDENT OF TEMPERATURE VARIATIONS

BACKGROUND OF THE INVENTION

1. Field of Invention

The present invention relates to a delay circuit with constant time delay independent of temperature variations.

2. Description of Related Art

In memory devices, such as DRAM, RC timing tracking is important. Also, RC timing may dominate delay amount of delay circuits and accordingly small RC timing variations are better. In general, the operation temperature ranges between +100° C.~−40° C. In this operation temperature range, RC timing may have large variations.

Figure 1:
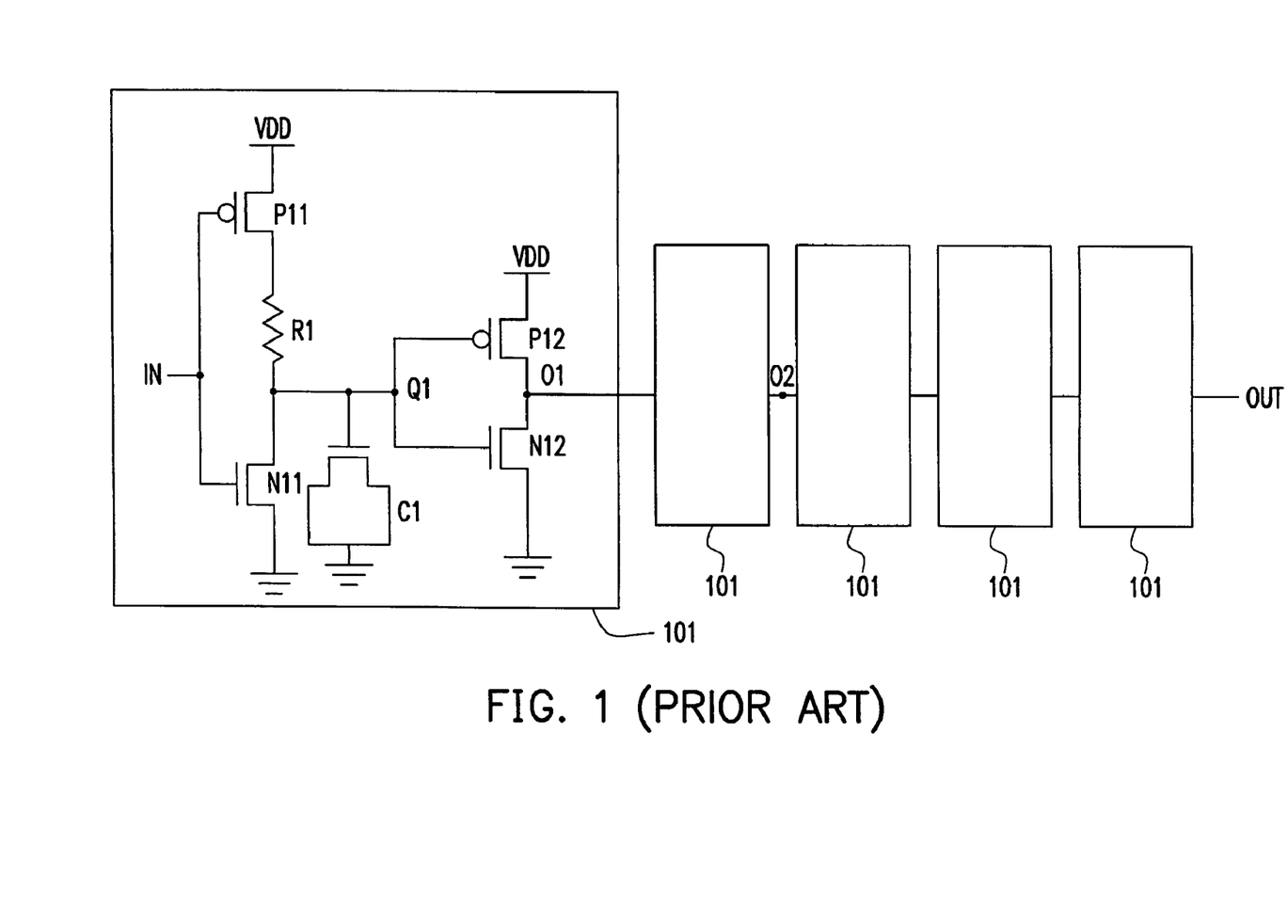
FIG. 1 shows a prior art delay circuit.

FIG. 1 shows a prior art delay circuit. This delay circuit may be used as output circuits. The delay circuit includes several, 5 for example, delay stages 101. The delay stage 101 includes an inverting receiver (formed by PMOS transistors P11, NMOS transistor N11 and resistor R1), a capacitor C1 and an output inverter (formed by PMOS transistors P12 and NMOS transistor N12).

In this prior delay circuit, R1 and C1 are used to compensate temperature variations of the input signal IN for generating an output signal OUT independent of temperature variations.

As known, operating characteristics of transistors vary with temperature changes. Transistors may operate slowly under high temperature and quickly under low temperature on the contrary. As a result, the delay time of the delay circuit undesirably varies with temperature. Changes in the operating temperature of delay circuits may cause its delay time to drift from its specified value.

The resistor R1 may be formed of polysilicon, for example, a polysilicon resistor, and the capacitor C1 may be formed using a gate capacitance of a transistor.

Figure 2:
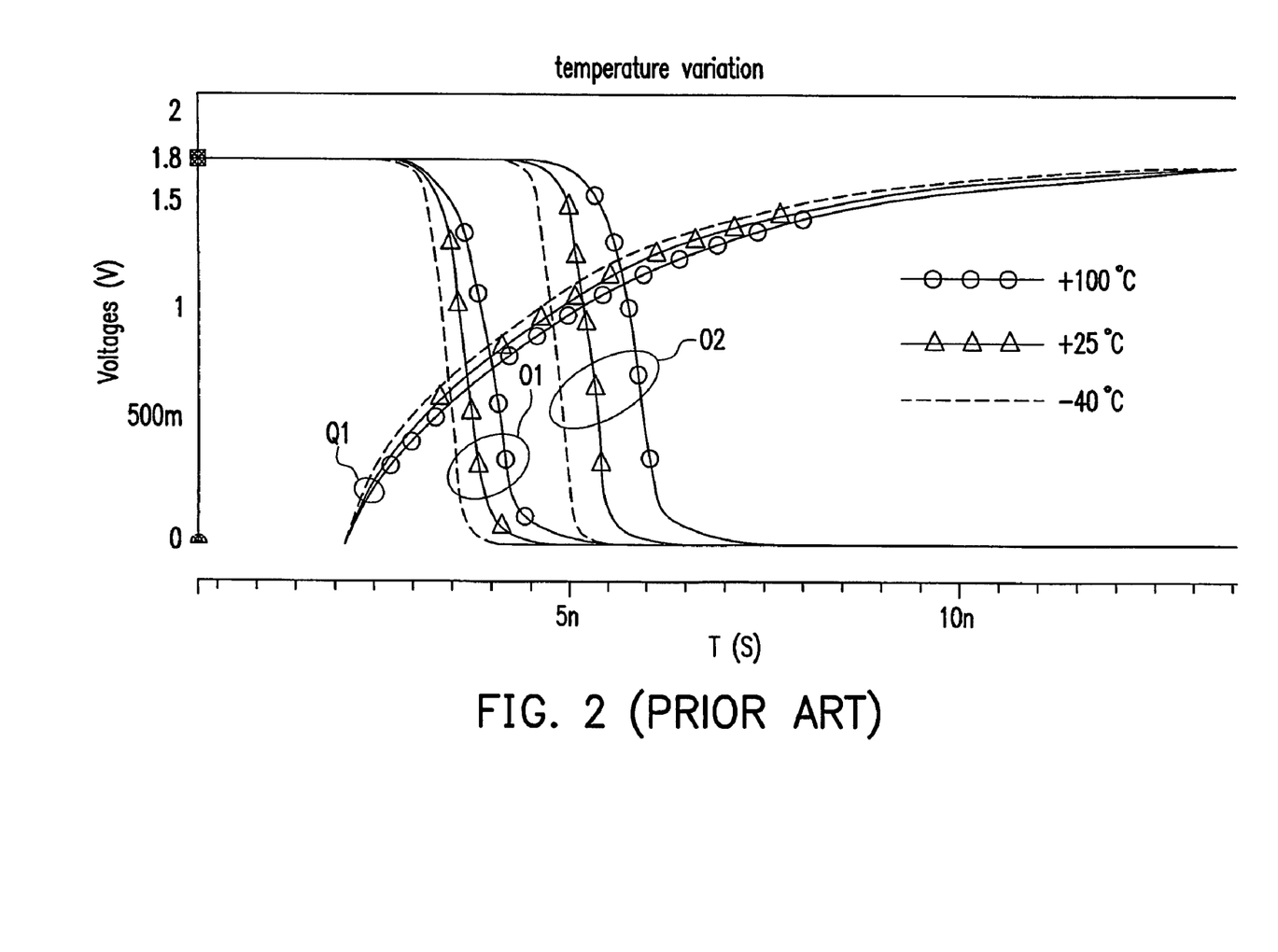
FIG. 2 shows a timing diagram between signals (Q1, O1 and O2) and temperature variations in accordance to FIG. 1.

FIG. 2 shows a timing diagram between signals (Q1, O1 and O2) and temperature variations of FIG. 1. Under high temperature, the current of MOS transistor is decreased, so the rising delay amount caused by FIG. 1 is increased. As shown in FIG. 2, temperature varies from +100° C.~−40° C. and the output signals O1 and O2 are divergent. This means, the output signal OUT is temperature dependent.

Thus, there is a need for an improved output circuit that almost maintains a specified delay time despite temperature variations.

SUMMARY OF THE INVENTION

The invention provides a delay circuit whose RC timing is more resistive to temperature variations.

The invention provides a delay circuit having constant time delay independent of temperature variations.

One example of the invention provides a delay circuit comprising: an inverting receiver, comprising a resistive element, the inverting receiver having an input node for receiving an input signal and an output node, the resistive element being coupled to the output node of the inverting receiver and an internal node in the inverting receiver; a capacitive element, coupled to the output node of the inverting receiver; a first transistor, having: a first terminal, coupled to the output node of the inverting receiver; a control terminal; and a second terminal; a second transistor, having: a first terminal; a control terminal, coupled to the input signal; and a second terminal, coupled to the second terminal of the first transistor; and an output inverter, having an input node coupled to the second terminal of the first transistor and an output node for outputting an output signal of the delay circuit; wherein the first transistor compensates delay of the inverting receiver as temperature varies; and the second transistor is used for generating a rail to rail signal on the second terminal of the first transistor. The delay circuit further includes a third transistor having: a first terminal; a control terminal, coupled to the output node of the inverting receiver; and a second terminal, coupled to the output node of the output inverter. The third transistor is used for enhancing pulling low of the output signal of the delay circuit.

Another example of the invention provides a delay circuit, comprising: an inverting receiver, comprising a resistive element, the inverting receiver having an input node for receiving an input signal and an output node, the resistive element being coupled to the output node of the inverting receiver and an internal node in the inverting receiver; a capacitive element, coupled to the output node of the inverting receiver; a first transistor, coupled to the output node of the inverting receiver and the capacitive element, a turned ON threshold voltage of the first transistor being varied as temperature varies; a second transistor, coupled to the input signal and the first transistor, the second transistor being used for shaping a rail to rail signal on the first transistor; and an output inverter, having an input node coupled to both the first and the second transistors and an output node for outputting an output signal of the delay circuit. The delay circuit further includes a third transistor coupled to the output node of the inverting receiver and the output node of the output inverter. The third transistor is used for enhancing pulling low ability on the output signal of the delay circuit.

In accordance to the connection of the resistive element in the inverting receiver and the transistor types for the first transistor and second transistor, the delay circuit may be applicable to delays with rising input and rising output and delays with falling input and falling output.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

In a delay circuit independent of temperature variations according to embodiments of the invention, a transistor providing negative temperature effect is used. Further, another transistor is used for generating a rail-to-rail signal on a terminal of the transistor providing negative temperature effect. Still further, another pulling down transistor is used for enhancing pulling low of output signals of the delay circuit.

Figure 3:
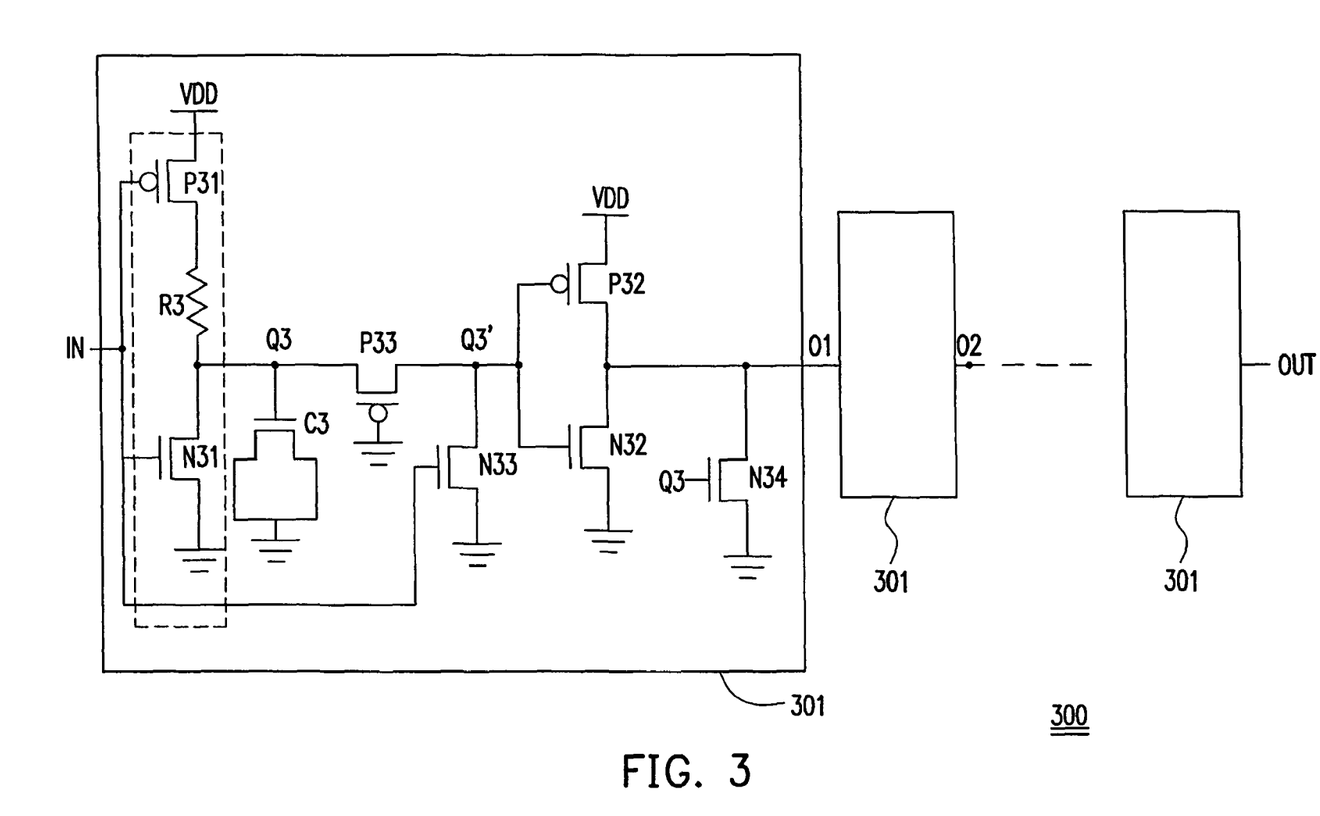
FIG. 3 shows a block diagram of a delay circuit independent of temperature variations according to an embodiment of the invention.

FIG. 3 shows a block diagram of a delay circuit independent of temperature variations according to an embodiment of the invention. FIG. 3 is applied for delay with falling input and falling output. Now please refer to FIG. 3. A delay circuit 300 includes one or more delay stages 301. Each delay stage 301 includes an inverting receiver (formed by PMOS transistor P31, NMOS transistor N31 and resistor R3), a capacitor C3, a PMOS transistor P33, an output inverter (formed by PMOS transistor P32 and NMOS transistor N32) and NMOS transistors N33~N34. Please note, in embodiments of the invention, an inverting receiver comprises a PMOS transistor, an NMOS transistor and a resistor, which is different from the well-known CMOS inverter having a PMOS transistor and an NMOS transistor.

The PMOS transistor P31 has a source terminal coupled to a power supply VDD, a gate terminal coupled to an input signal IN and a drain terminal coupled to one terminal of the resistor R3. The NMOS transistor N31 has a source terminal coupled to GND, a gate terminal coupled to the input signal IN and a drain terminal coupled to another terminal (i.e. node Q3) of the resistor R3.

The resistor R3 is coupled between the drain of the PMOS transistor P31 and the drain of the NMOS transistor N31. The capacitor C3 is coupled between the node Q3 and GND.

The PMOS transistor P33 has a source terminal coupled to the node Q3, a gate terminal coupled to GND and a drain terminal coupled to node Q3'.

The NMOS transistor N33 has a source terminal coupled to GND, a gate terminal coupled to the input signal IN and a drain terminal coupled to the node Q3'.

The PMOS transistor P32 has a source terminal coupled to the power supply VDD, a gate terminal coupled to the node Q3' and a drain terminal coupled to an output signal O1. The NMOS transistor N32 has a source terminal coupled to GND, a gate terminal coupled to the node Q3' and a drain terminal coupled to the output signal O1.

The NMOS transistor N34 has a source terminal coupled to GND, a gate terminal coupled to the node Q3 and a drain terminal coupled to the output signal O1.

Figure 4:
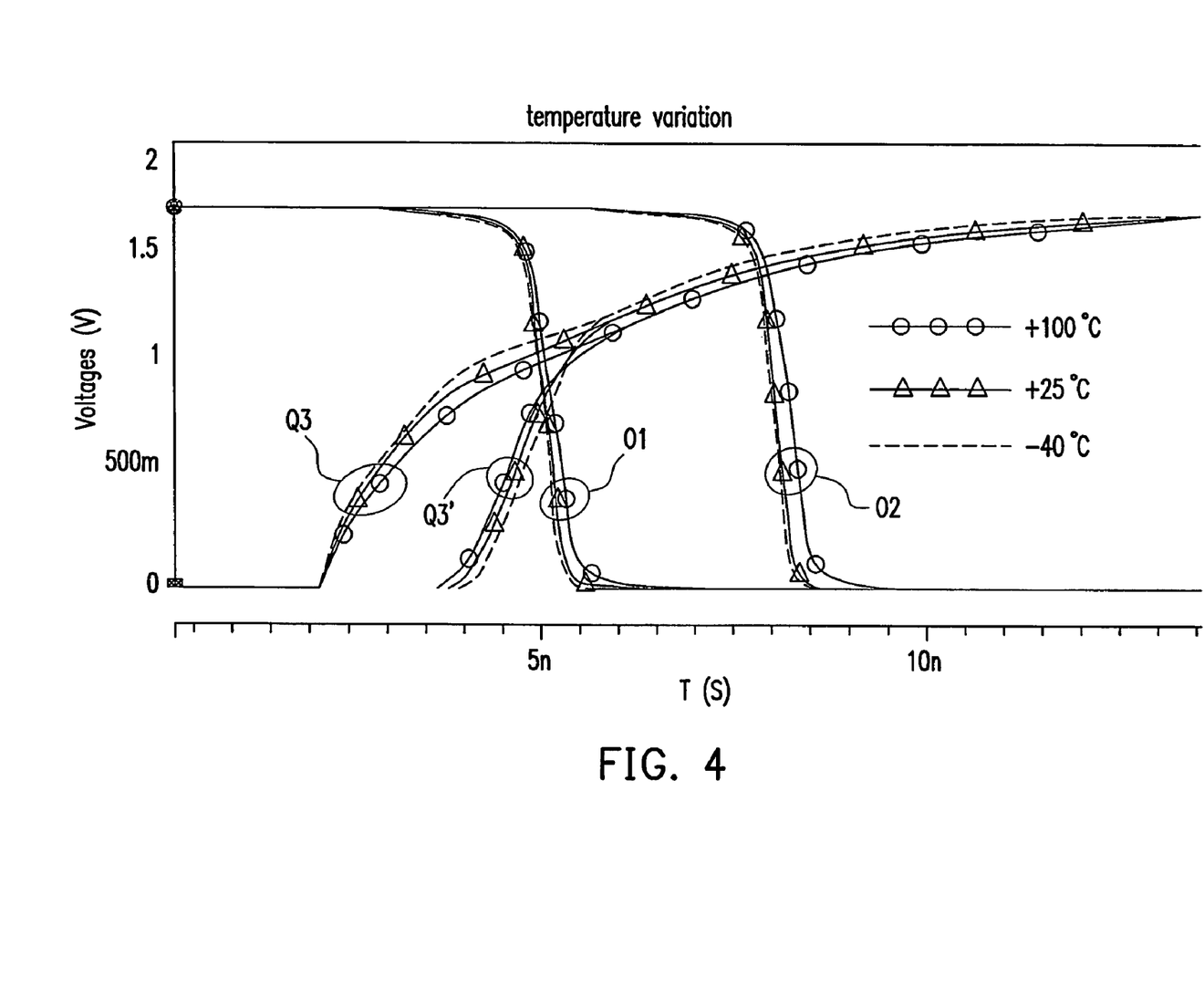
FIG. 4 shows a timing diagram between signals (Q3, Q3', O1 and O2) and temperature variations according to the embodiment in FIG. 3.

At low ambient temperature, saturation current of the MOS transistor becomes higher and Q3 rises faster; but the threshold voltage of the PMOS transistor P33 becomes higher, so the PMOS transistor P33 turns ON later. On the contrary, at high ambient temperature, saturation current of the MOS transistor becomes lower and Q3 rises slower; but the threshold voltage of the PMOS transistor P33 becomes lower, so the PMOS transistor P33 turns ON earlier. In other words, as ambient temperature raises, lower turn-on voltage of the PMOS transistor P33 compensates the lower saturation currents in the receiving inverter and in the output inverter and introduces less temperature sensitive output. Negative temperature effect provided by the PMOS transistor P33 relies on that, delay amount (between node Q3 and Q3', as shown in FIG. 4) caused by the PMOS transistor P33 at low ambient temperature is larger than delay amount caused by the PMOS transistor P33 at high ambient temperature. Or said, higher ambient temperature, smaller delay amount caused by the PMOS transistor P33.

The NMOS transistor N33 is used to compensate the threshold voltage loss by the PMOS transistor P33 and shape rail to rail logic LOW waveforms at node Q3'. When the input signal IN is HIGH, the node Q3 is at logic LOW (0V); and the NMOS transistor N33 is ON for pulling the node Q3' to logic LOW.

The NMOS transistor N34 is used for enhancing pulling low of the output signal O1. When the input signal IN is logic HIGH, the output signal O1 is logic HIGH, pulled up by the PMOS transistor P32. When the input signal IN is logic LOW, the output signal O1 is logic LOW, pulled down by both the NMOS transistors N32 and N34.

FIG. 4 shows a timing diagram between signals (Q3, Q3', O1 and O2) and temperature variations according to the embodiment. As shown in FIG. 4, in temperature range from +100° C.~−40° C., the output signals O1 and O2 are more convergent than the output signals O1 and O2 in FIG. 2. This means, the output signals O1, O2 and OUT may be regarded as being temperature independent. Further, the PMOS transistor P33 provides temperature compensation for the node Q3' during temperature variations. For example, around T=5 ns, voltages on the node Q3' rises earlier as the temperature increases while voltages on the node Q3 is slower as the temperature increases.

Figure 5:
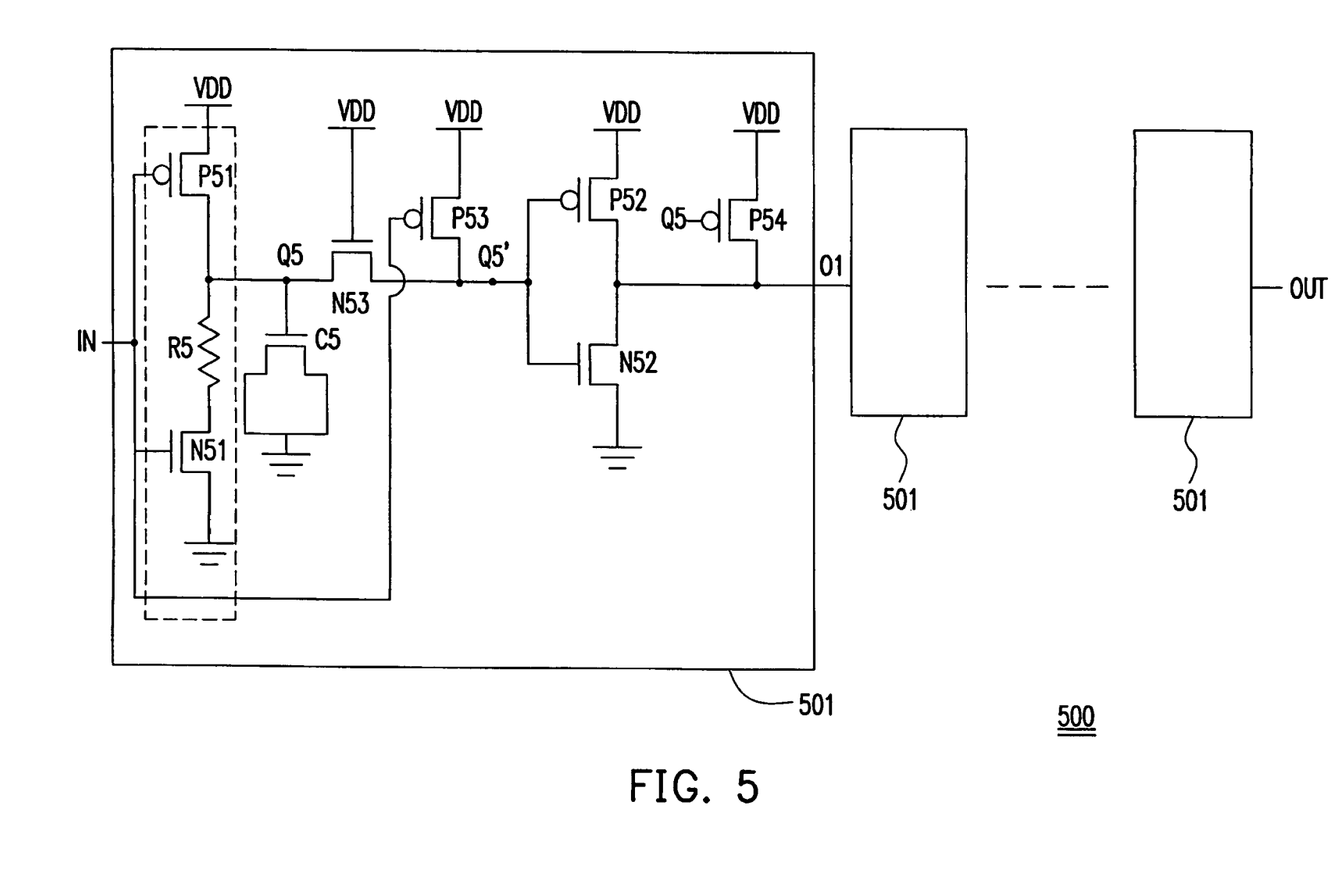
FIG. 5 shows a block diagram of a delay circuit independent of temperature variations according to a modification of the embodiment of the invention.

FIG. 5 shows a block diagram of a delay circuit independent of temperature variations according to a modification of the embodiment of the invention. FIG. 5 is applied for delay with rising input and rising output. A delay circuit 500 includes one or more delay stages 501. Each delay stage 501 includes an inverting receiver (formed by PMOS transistor P51, NMOS transistor N51 and resistor R5), a capacitor C5, a NMOS transistor N53, an output inverter (formed by PMOS transistor P52 and NMOS transistor N52) and PMOS transistors P53~P54. Q5 and Q5' are internal nodes. The PMOS transistor P51, the NMOS transistor N51, the capacitor C5, the NMOS transistor N53, the PMOS transistor P52, the NMOS transistor N52 and the PMOS transistors P53~P54 have the same or similar function with those similar elements in FIG. 3. The resistor R5 is connected between the node Q5 and the drain terminal of the NMOS transistor N51.

Figure 6:
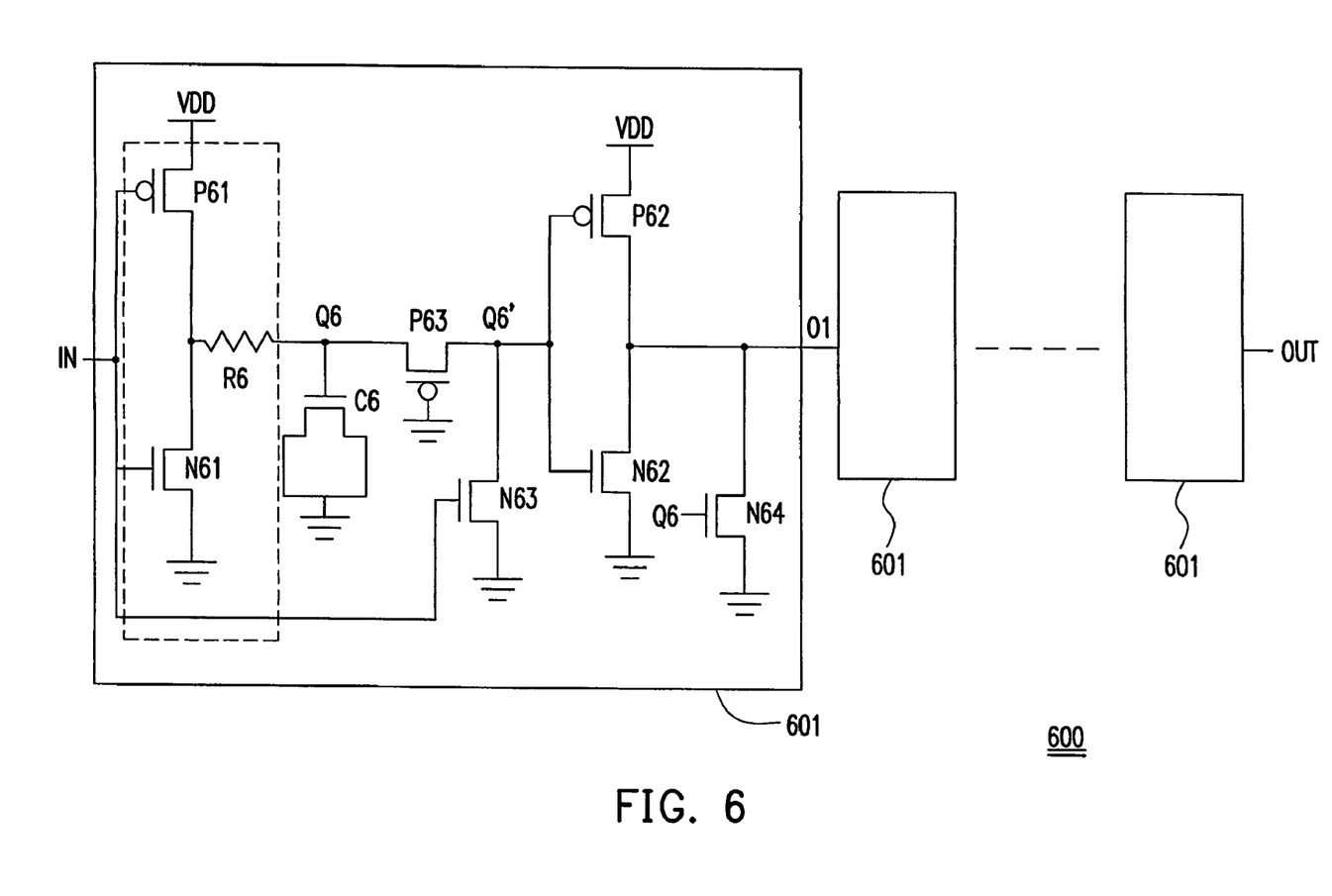
FIG. 6 shows a block diagram of a delay circuit independent of temperature variations according to another modification of the embodiment of the invention.

FIG. 6 shows a block diagram of a delay circuit independent of temperature variations according to another modification of the embodiment of the invention. FIG. 6 is applied for delay with falling input and falling output. A delay circuit 600 includes one or more delay stages 601. Each delay stage 601 includes an inverting receiver (formed by PMOS transistor P61, NMOS transistor N61 and resistor R6), a capacitor C6, a PMOS transistor P63, an output inverter (formed by PMOS transistor P62 and NMOS transistor N62) and NMOS transistors N63~N64. Q6 and Q6' are internal nodes. The PMOS transistor P61, the NMOS transistor N61, the capacitor C6, the PMOS transistor P63, the PMOS transistor P62, the NMOS transistor N62 and the NMOS transistors N63~N64 have the same or similar function with those similar elements in FIG. 3 and their description is omitted here for simplicity. The resistor R6 is connected between an output node of the inverting receiver and the node Q6.

Figure 7:
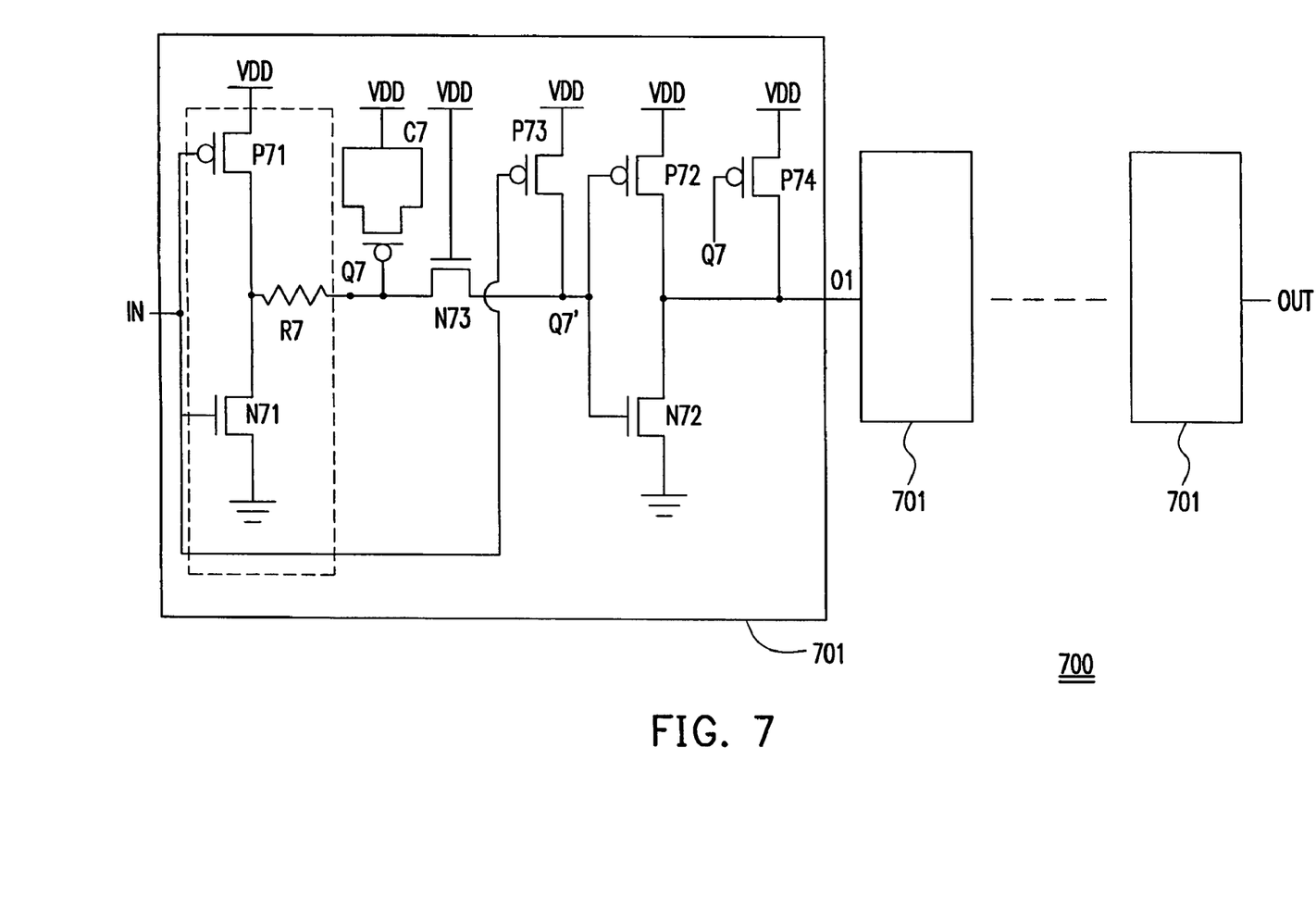
FIG. 7 shows a block diagram of a delay circuit independent of temperature variations according to still another modification of the embodiment of the invention.

FIG. 7 shows a block diagram of a delay circuit independent of temperature variations according to still another modification of the embodiment of the invention. FIG. 7 is also applied for delay with rising input and rising output. A delay circuit 700 includes one or more delay stages 701. Each delay stage 701 includes an inverting receiver (formed by PMOS transistor P71, NMOS transistor N71 and resistor R7), a capacitor C7, a NMOS transistor N73, an output inverter (formed by PMOS transistor P72 and NMOS transistor N72) and PMOS transistors P73~P74. Q7 and Q7' are internal nodes. The PMOS transistor P71, NMOS transistor N71, the resistor R7, the capacitor C7, the NMOS transistor N73, the PMOS transistor P72, the NMOS transistor N72 and the PMOS transistors P73~P74 have the same or similar function with those similar elements in FIG. 3 and their description is omitted here for simplicity. The resistor R7 is connected between an output node of the inverting receiver and the node Q7.

In the above embodiment and its modifications, the capacitors (for example, C3, C5, C6 and C7) may be coupled between the internal node and a reference level (GND or VDD). For example, the capacitor C5 in FIG. 5 may be modified as being coupled between the node Q5 and the power supply VDD.

As stated above, in the embodiment, the RC timing is almost resistive to temperature variations. Therefore, the delay circuit according to the embodiments of the invention has constant time delay independent of temperature variations.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A delay circuit, comprising:
an inverting receiver, consisting of one inverter, the inverter having one resistive element, the inverting receiver having an input node for directly receiving an input signal and an output node, the resistive element being coupled to the output node of the inverting receiver and an internal node in the inverting receiver;
a capacitive element, having: a first terminal, coupled to the output node of the inverting receiver; and a second terminal coupled to a ground;
a first transistor, having: a first terminal, coupled to the output node of the inverting receiver; a control terminal, coupled to the ground; and a second terminal;
a second transistor, having: a control terminal, directly receiving the input signal; a first terminal coupled to the ground; and a second terminal, coupled to the second terminal of the first transistor, wherein the second transistor is a NMOS transistor; and
an output inverter, having an input node coupled to the second terminal of the first transistor and an output node for outputting an output signal of the delay circuit;
wherein the first transistor compensates delay of the inverting receiver as temperature varies; and the second transistor is used for generating a rail to rail signal on the second terminal of the first transistor.

2. The delay circuit of claim 1, further comprising:
a third transistor, having: a first terminal; a control terminal, coupled to the output node of the inverting receiver; and a second terminal, coupled to the output node of the output inverter;
the third transistor being used for enhancing pulling low of the output signal of the delay circuit.

3. The delay circuit of claim 1, wherein the inverting receiver includes:
a fourth transistor, having a first terminal coupled to a power supply level, a control terminal coupled to the input signal and a second terminal; and
a fifth transistor, having a first terminal coupled to a GND level, a control terminal coupled to the input signal and a second terminal.

4. The delay circuit of claim 3, wherein the resistive element in the inverting receiver has: a first terminal, coupled to the second terminal of the fourth transistor; and a second terminal, coupled to both the second terminal of the fifth transistor and the output node of the inverting receiver.

5. The delay circuit of claim 3, wherein the resistive element in the inverting receiver has: a first terminal coupled to both the second terminal of the fourth transistor and the output node of the inverting receiver; and a second terminal, coupled to the second terminal of the fifth transistor.

6. The delay circuit of claim 3, wherein the resistive element in the inverting receiver has: a first terminal coupled to both the second terminal of the fourth transistor and the second terminal of the fifth transistor; and a second terminal, coupled to the output node of the inverting receiver.

7. The delay circuit of claim 1, wherein the output inverter includes:
a sixth transistor, having: a first terminal, coupled to a power supply level; a control terminal, coupled to both the second terminal of the first transistor and the second terminal of the second transistor; and a second terminal for providing the output signal of the delay circuit; and
a seventh transistor, having: a first terminal, coupled to a GND level; a control terminal, coupled to both the second terminal of the first transistor and the second terminal of the second transistor; and a second terminal for providing the output signal of the delay circuit.

8. A delay circuit, comprising:
an inverting receiver, consisting of one inverter, the inverter having one resistive element, the inverting receiver having an input node for directly receiving an input signal and an output node, the resistive element being coupled to the output node of the inverting receiver and an internal node in the inverting receiver;
a capacitive element, having: a first terminal, coupled to the output node of the inverting receiver; and a second terminal, coupled to a ground;
a first transistor, having: a first terminal, coupled to the output node of the inverting receiver and the capacitive element; a control terminal, coupled to the ground; and a second terminal, wherein a turned ON threshold voltage of the first transistor being varied as temperature varies;
a second transistor, a control terminal of the second transistor directly receiving the input signal, a first terminal of the second transistor being coupled to the ground, and a second terminal of the second transistor being coupled to the second terminal of the first transistor, the second transistor being used for shaping a rail to rail signal on the first transistor, wherein the second transistor is a NMOS transistor; and
an output inverter, having an input node coupled to both the first and the second transistors and an output node for outputting an output signal of the delay circuit.

9. The delay circuit of claim 8, further including:
a third transistor, coupled to the output node of the inverting receiver and the output node of the output inverter, the third transistor being used for enhancing pulling low ability on the output signal of the delay circuit.

10. The delay circuit of claim 8, wherein the inverting receiver includes:

a fourth transistor, having a first terminal coupled to a power supply level, a control terminal coupled to the input signal and a second terminal; and a fifth transistor, having a first terminal coupled to a GND level, a control terminal coupled to the input signal and a second terminal.

11. The delay circuit of claim 10, wherein the resistive element has: a first terminal, coupled to the second terminal of the fourth transistor; and a second terminal, coupled to both the second terminal of the fifth transistor and the output node of the inverting receiver.

12. The delay circuit of claim 10, wherein the resistive element has: a first terminal coupled to both the second terminal of the fourth transistor and the output node of the inverting receiver; and a second terminal, coupled to the second terminal of the fifth transistor.

13. The delay circuit of claim 10, wherein the resistive element has: a first terminal coupled to both the second terminal of the fourth transistor and the second terminal of the fifth transistor; and a second terminal, coupled to the output node of the inverting receiver.

14. The delay circuit of claim 8, wherein the output inverter includes:

a sixth transistor, having: a first terminal, coupled to a power supply level; a control terminal, coupled to both the first transistor and the second transistor; and a second terminal for providing the output signal of the delay circuit; and a seventh transistor, having: a first terminal, coupled to a GND level; a control terminal, coupled to both the first transistor and the second transistor; and a second terminal for providing the output signal of the delay circuit.

* * * * *